United States Patent [19]

Funaba

[11] Patent Number: 5,061,977
[45] Date of Patent: Oct. 29, 1991

[54] SEMICONDUCTOR PHOTODETECTOR DEVICE

[75] Inventor: Shinji Funaba, Itami, Japan

[73] Assignee: Mitsubishi Denki Kabushiki Kaisha, Japan

[21] Appl. No.: 638,545

[22] Filed: Jan. 8, 1991

[30] Foreign Application Priority Data

Jul. 24, 1990 [JP] Japan .................................. 2-198263

[51] Int. Cl.⁵ ............................................. H01L 27/14
[52] U.S. Cl. ........................................ 357/30; 357/16; 357/86; 357/88; 357/58
[58] Field of Search ..................... 357/16, 30, 86, 88, 357/58

[56] References Cited

U.S. PATENT DOCUMENTS 4,887,138 12/1989 Gardner ................................ 357/30

OTHER PUBLICATIONS

Yonetsu et al., "Light-Emitting ... Devices", Kogayu Tosho Suppan Kabushiki Kaisha, Feb. 15, 1984.

Primary Examiner—Edward J. Wojciechowicz
Attorney, Agent, or Firm—Leydig, Voit & Mayer

[57] ABSTRACT

A fast-response semiconductor photodetector device includes a semiconductor light-absorptive layer of a first conductivity type disposed on a semiconductor substrate of the first conductivity type, and a light-transmissive layer on the light-absorptive layer having a smaller relative dielectric constant than the light-absorptive layer. A semiconductor region of a second conductivity type is selectively formed in the light-transmissive layer to a depth which is less than the thickness of the light-transmissive layer. The second conductivity type region has includes extensions extending into the light-absorptive layer.

6 Claims, 8 Drawing Sheets

SEMICONDUCTOR PHOTODETECTOR DEVICE

This invention relates to a semiconductor photodetector device usable in optical communications.

BACKGROUND OF THE INVENTION

FIG. 1 is a cross-sectional view of a conventional semiconductor photodetector device such as shown, for example, in "*HIKARI TSUSHIN SOSHI KOGAKU*", by Hiroo Yonetsu, published by Kogaku-Tosho Kabushiki Kaisha, page 372, in FIG. 6.7(c). This conventional photodetector device is now described in terms of a PIN photodiode having a P+-type diffusion region/N⁻-type InGaAs/N-type InP structure.

In FIG. 1, a first conductivity type semiconductor substrate 2 comprises an N+-type InP semiconductor layer 3 and an N-type InP buffer layer 4 disposed on the layer 3. An electrode 1 on the N side of the PIN structure (hereinafter referred to as N-electrode) is disposed on one of the major surfaces of the semiconductor substrate 2, and an N⁻-type InGaAs light-absorptive layer 5 is disposed on the other major surface. A light-transmissive layer 6 of N⁻-type InGaAsP is disposed on the light-absorptive layer 5. Alternatively, the light-transmissive layer 6 may be formed of N⁻-InP. A P+-type diffusion region 7, which is a second conductivity type semiconductor region, is formed to extend through the light-transmissive layer 6 into the light-absorptive layer 5. A P-N junction 13 is formed between the P+-type diffusion region 7 and the first conductivity type or N-type semiconductor which forms the light-absorptive layer 5 and the light-transmissive layer 6. The bottom portion 14 of the P-N junction 13 is located in the light-absorptive layer 5. A broken line 15 indicates the boundary of a depletion region 8 formed due to the presence of the P-N junction 13.

An $Si_3N_4$ surface protection film 9, an anti-reflection film 10, and an electrode contact 11 are disposed on the surface of the light-transmissive layer 6, and an electrode 12 on the P side of the PIN structure (hereinafter referred to as P-electrode) is disposed on the surface protection layer 9 contacting the electrode contact 11.

Next, the operation of the conventional semiconductor photodetector device shown in FIG. 1 is explained.

FIG. 2 shows a circuit diagram in which 1 he semiconductor photodetector device of FIG. 1, i.e. a PIN photodiode 30, is used. In FIG. 2, hν represents a photon incident on the photodiode 30.

The PIN photodiode 30 with the structure shown in FIG. 1 is typically used in such a circuit arrangement as shown in FIG. 2. The PIN photodiode 30 is connected through a resistor 31 to a voltage source 32 which applies a reverse bias to the photodiode 30.

Light which enters into the P+-type diffusion region 7 (FIG. 1) of the PIN photodiode 30 through the anti-reflection layer 10 passes through the light-transmissive layer 6 and, then, is absorbed by the light-absorptive layer 5 to produce electron-hole pairs. Electrons and holes are separated by the electric field in the depletion region 8 so that electromotive force is generated between the N-electrode 1 and the P-electrode 12. The width of the depletion region 8 can be controlled by a bias voltage applied between the N-electrode 1 and the P-electrode 12. However, in the case of the conventional photodiode shown in FIG. 1 in which the depletion region 8 is located in the light-absorptive layer 5 whenever light is incident, an electromotive force is generated to provide light-induced current, with no bias voltage applied between the electrodes 1 and 12.

The depletion region 8 formed by the P-N junction 13 has a depletion region capacitance determined by the relative dielectric constant of the material used. The capacitance of the depletion region B affects the response speed of the photodiode 30. The response speed is dependent on the magnitude of a CR time constant, and the response speed decreases with an increase of the CR time constant. The capacitance C of the CR time constant is provided essentially by the capacitance $C_B$ of the depletion region 8 which is expressed by the formula (1).

$$C_B = A \sqrt{\frac{k\epsilon_o q N_B}{2(V_D + V_b)}} \quad (1)$$

In the formula (1),

A represents the area of the P-N junction 13;

k represents the relative dielectric constant of the material of the layers 5 and 6;

$N_B$ represents the carrier concentration in the layers 5 and 6;

$V_b$ represents the bias voltage applied between the electrodes 1 and 12;

$V_D$ represents a built-in voltage; and $\epsilon_o$ and q are the dielectric constant of a vacuum and the electronic charge, respectively.

The resistance R of the CR time constant is a load resistor for light-induced current (high frequency current) flowing through a coupling capacitor 34 between output terminals 35 and 36 and is equivalent to the value $R_L$ of a load resistor 33 shown in FIG. 2.

FIG. 3 is a cross-sectional view of another example of a conventional semiconductor photodetector device.

The device of FIG. 3 is different from the device shown in FIG. 1 only in that both the P+-type diffusion region 7 and the depletion region 8 formed by the P-N junction 13 are located only within the light-transmissive layer 6. Now assume that the carrier concentrations $N_B$ of the light-transmissive layer 6 and the light-absorptive layer 5 are of the same order, and that the relative dielectric constant of the light-transmissive layer 6 is smaller than that of the light-absorptive layer 5. Then, as is understood from the formula (1), the device has a smaller depletion region capacitance and, hence, a higher response speed than a device such as the one shown in FIG. 1 in which the depletion region is formed to extend through the light-transmissive layer 6 into the light-absorptive layer 5. Needless to say, if the carrier concentration $N_B$ of the light-transmissive layer 6 is smaller than that of the light-absorptive layer 5, the depletion region capacitance is smaller and, accordingly, the response speed is much higher.

In this example, however, since the light-absorptive layer 5 does not include the depletion region 8, electron-hole pairs recombine without being separated into electrons and holes, so that no electromotive force is generated. Therefore, in order to obtain a light-induced current, it is necessary to apply a bias voltage sufficient to make the boundary 15 of the depletion region 8 extend into the light-absorptive layer 5.

Because of the above-described structures, conventional photodetector devices have problems including the following ones. When such a conventional semiconductor photodetector device is used in an optical communications system, it is coupled to an optical fiber device. In an arrangement where light from the end of the optical fiber is introduced directly into the light-incident surface of the semiconductor photodetector device, because the light beam diverges, the coupling between them is easier as the area of the light-incident surface of the photodetector device increases. A larger light receiving area or larger P-N junction area is also desirable for obtaining a larger light-induced current. However, as the P-N junction area increases, the depletion region associated with the P-N junction becomes larger accordingly. In FIG. 4, an equivalent circuit for the total depletion region capacitance $C_B$ of the conventional semiconductor photodetector device of FIG. 1 is shown in terms of depletion region capacitance $C_1$ per unit area. As is seen from FIG. 4, with increase in area of the P-N junction, the number of depletion region capacitances $C_1$ per unit area connected in parallel and, hence, the total depletion region capacitance $C_B$ increases. Accordingly, the CR time constant increases. This means that the response speed of the resulting semiconductor photodetector device is slow. Accordingly, it is desirable that the relative dielectric constant of the zone where there is a depletion region be as small as possible.

In the conventional semiconductor photodetector device of FIG. 3 since both the $P^+$-type diffusion region 7 and the depletion region 8 are located only within the light-transmissive layer 6, the depletion region capacitance is small and, accordingly, the response speed is high. However, during its operation a bias voltage must be applied so that the depletion region can extend into the light-absorptive layer 5. When a bias voltage is applied, leakage current caused by crystal defects and surface leakage current at the surface which the P-N junction intersects increase so that the S/N ratio for the output, the result of the light-induced current and the leakage currents, is degraded.

SUMMARY OF THE INVENTION

The object of the present invention is to provide a fast-response, highly reliable semiconductor photodetector device which is free of the problems accompanying conventional semiconductor photodetector devices as described above. The device according to the present invention has a smaller depletion region capacitance and it can produce a light-induced current even with zero bias.

A semiconductor photodetector device according to the present invention comprises a semiconductor light-transmissive layer of a first conductivity type which is disposed on a semiconductor light-absorptive layer of the first conductivity type and has a relative dielectric constant smaller than that of the light-absorptive layer. A semiconductor region of a second conductivity type is selectively formed in the light-transmissive layer to a depth less than the thickness of the light-transmissive layer. The second conductivity type semiconductor region includes portions which extend into the light-absorptive layer.

In the semiconductor photodetector device of the present invention the total depletion region capacitance is small because it comprises a parallel combination of the series combination of the depletion region capacitance of the light-absorptive layer and the depletion region capacitance of the light-transmissive layer with the depletion region capacitance only of the light-absorptive layer, and, because the boundary of the depletion region is located in the light-absorptive layer, a light-induced current can be derived with zero bias applied to the device.

DESCRIPTION OF PREFERRED EMBODIMENTS

Now, the semiconductor photodetector device of the present invention is described in detail with reference to the accompanying drawings which show some embodiments of the present invention.

Figure 5:
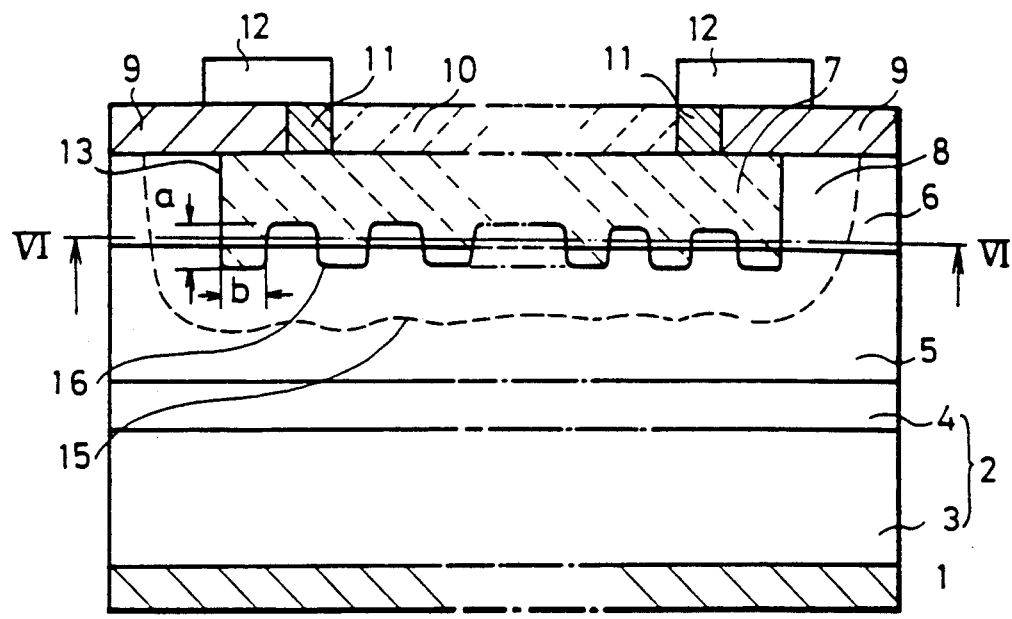
FIG. 5 is a cross-sectional view of a semiconductor photodetector device according to one embodiment of the present invention.
Figure 6:
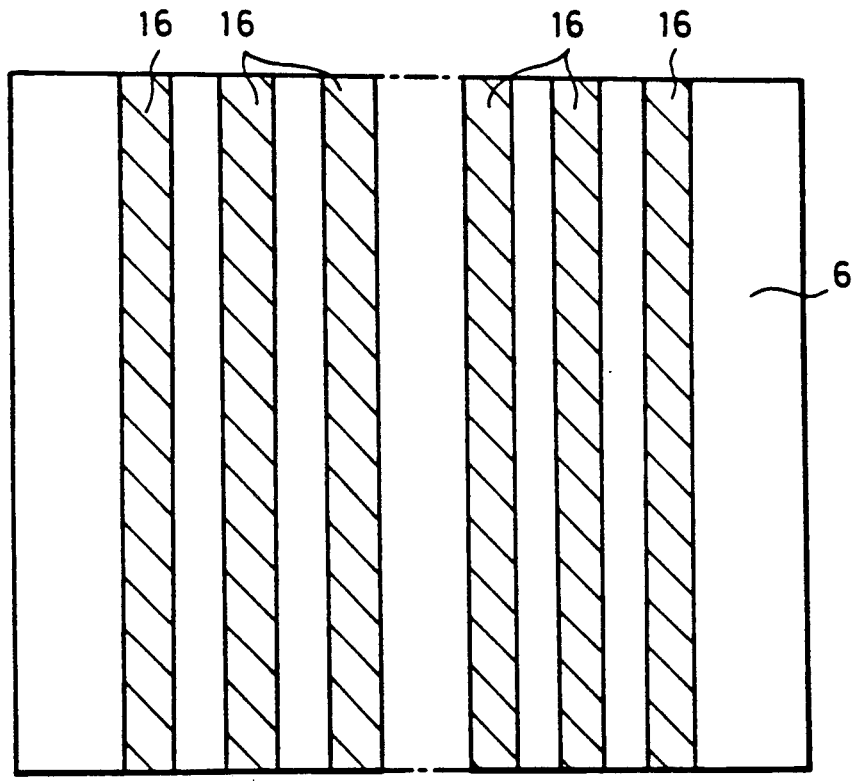
FIG. 6 is a cross-sectional view taken along section line VI—VI of FIG. 5.

FIG. 5 illustrates one embodiment of the present invention. The device of FIG. 5 is a PIN photodiode having a $P^+$-type diffusion region/$N^-$-type InGaAs/N-type InP structure. FIG. 6 shows the cross-section of the device of FIG. 5 along section line VI—VI of FIG. 5.

Figure 1:
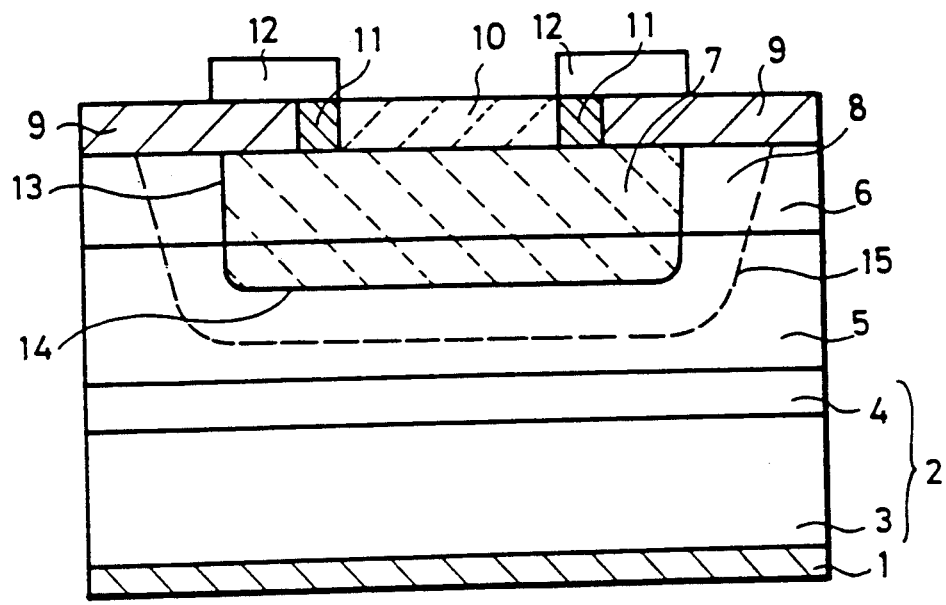
FIG. 1 is a cross-sectional view of a first example of conventional semiconductor photodetector device.
Figure 2:
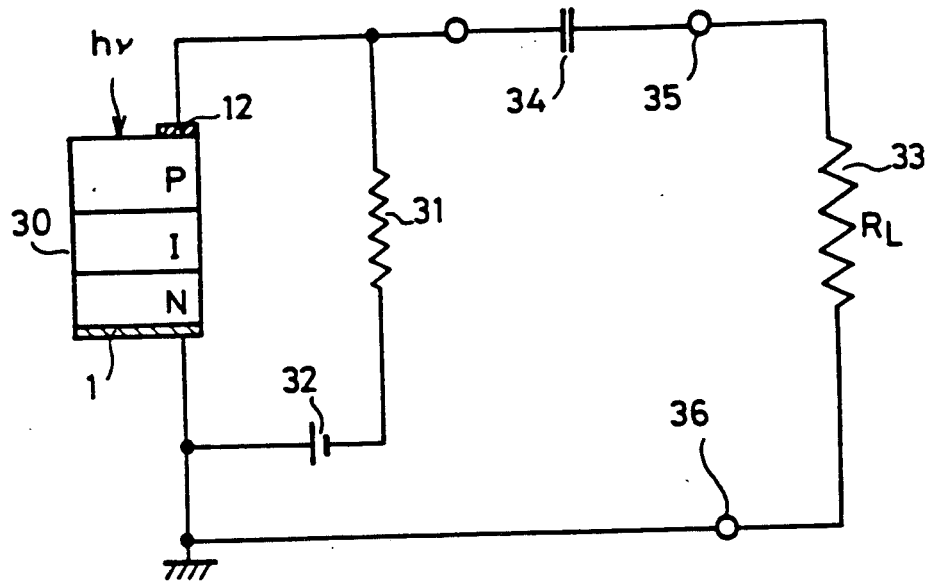
FIG. 2 is a circuit diagram showing how the semiconductor photodetector device of FIG. 1 is used.
Figure 3:
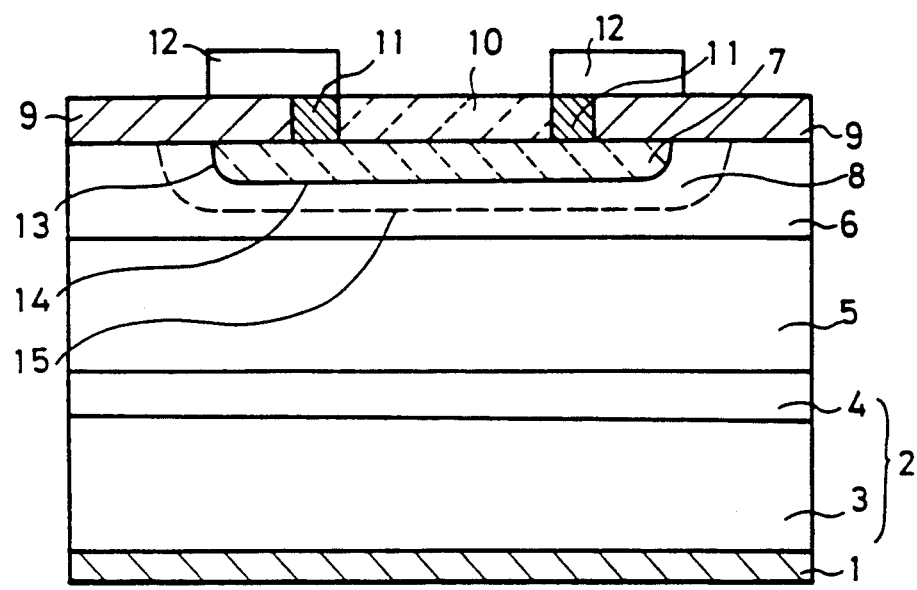
FIG. 3 is a cross-sectional view of a second example of conventional semiconductor photodetector device.
Figure 4:
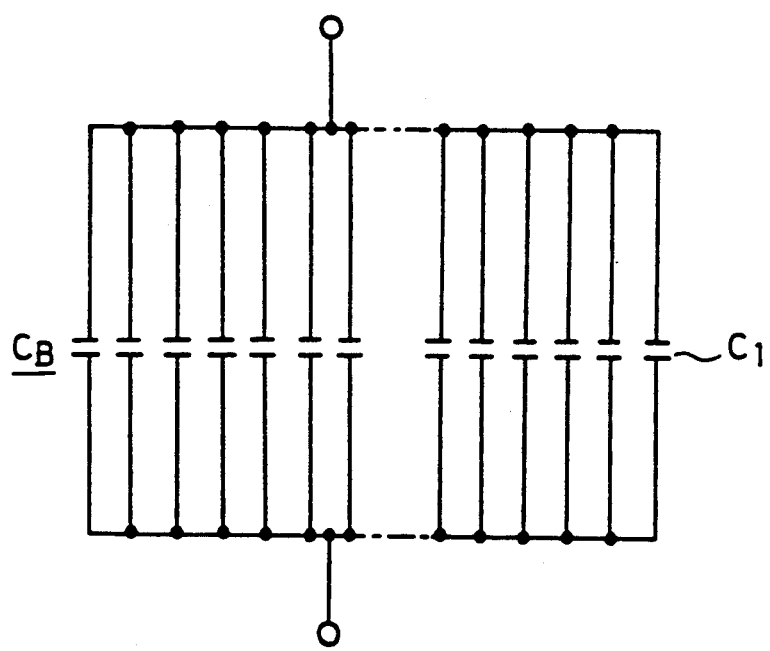
FIG. 4 is an equivalent circuit illustrating the depletion region capacitance of the conventional semiconductor photodetector device shown in FIG. 1.

Similar to the conventional device shown in FIG. 1, the semiconductor photodetector device of FIG. 5 includes a semiconductor substrate 2 of a first conductivity type, e.g. N-type, comprising an $N^+$-type InP semiconductor layer 3 and an $N^-$-type InP buffer layer 4. An N-electrode 1 is disposed on one major surface of the semiconductor substrate 2, and an $N^-$-type InGaAs light-absorptive layer 5 is disposed on the other major surface. An $N^-$-type InGaAsP light-transmissive layer 6 having a smaller relative dielectric constant than the light-absorptive layer 5 is disposed on the light-absorptive layer 5. Alternatively, the material of the light-transmissive layer 6 may be $N^-$-type InP.

According to the present invention an essential portion of a $P^+$-type (second conductivity type) diffusion region 7 is formed in the light-transmissive layer 6 with its bottom being located at a depth less than the thickness of the layer 6, as shown in FIG. 5. The $P^+$-type diffusion region 7 includes periodically repeating projections 16 which extend from the bottom of the region 7 into the light-absorptive layer 5. In other words, only the periodic projections 16 of the $P^+$-type diffusion region 7 are formed to extend across the boundary between the light-transmissive layer 6 and the light-absorptive layer 5. The dimensions a and b of the projections 16 are both about 1 μm or so. Accordingly, although portions of the P-N junction 13 between the N-type semiconductor and the P-type semiconductor are located within the light-transmissive layer 6 those portions of the boundary 15 of a depletion region 8 within the light-absorptive layer 5 at locations where the projections 16 are not present are only slightly depressed toward the light-transmissive layer 6, but never extend into the light-transmissive layer 6.

Figure 7:
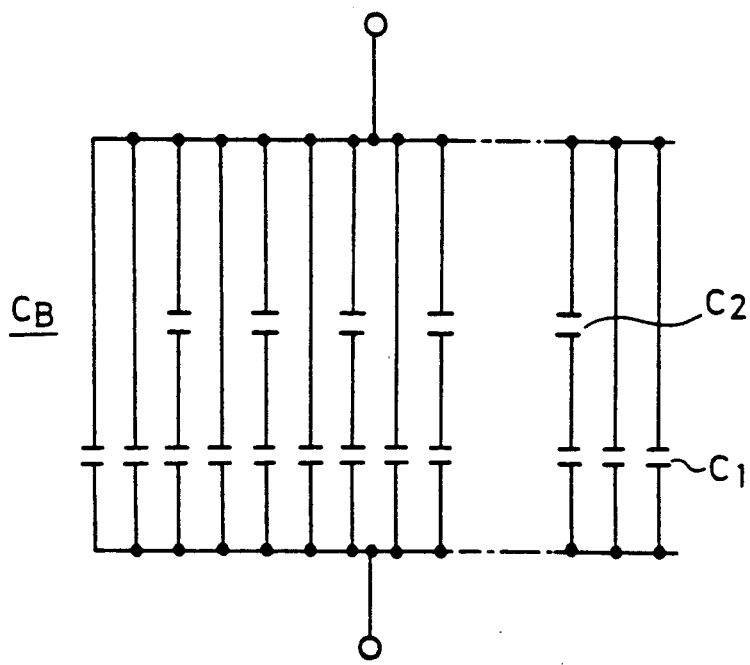
FIG. 7 is an equivalent circuit illustrating the depletion region capacitance of the semiconductor photodetector device of the present invention.

FIG. 7 shows an equivalent circuit of the depletion region capacitance of the semiconductor photodetector device of the present invention shown in FIG. 5. In comparison with the conventional device, although the depletion region capacitance per unit area at portions where the P-N junction is located within he light-absorptive layer 5 is $C_1$ which is equal to that of the conventional device, the depletion region capacitance per unit area at portions where the P-N junction is located within the light-transmissive layer 6 is smaller because it comprises a series combination of the depletion region capacitance $C_1$, the capacitance provided by the light-absorptive layer 5, and the depletion region capacitance $C_2$ provided by the light-transmissive layer 6 which has a smaller relative dielectric constant than the layer 5. As a result, the semiconductor photodetector device of the present invention has a smaller total depletion region capacitance $C_B$ and, accordingly, a higher response speed than the conventional devices.

Furthermore, because the boundary 15 of the depletion region 8 is only slightly depressed toward the light-transmissive layer 6 at portions where the P-N junction 13 is located within the layer 6 and, accordingly, the depletion region boundary 15 as a whole is located within the light-absorptive layer 5, light-induced current can be derived with no bias applied lo the device.

The semiconductor photodetector device of FIG. 5 may be fabricated in the following manner.

FIGS. 8 through 13 are cross-sectional views of the semiconductor photodetector device of the present invention in different manufacturing steps.

Figure 8:
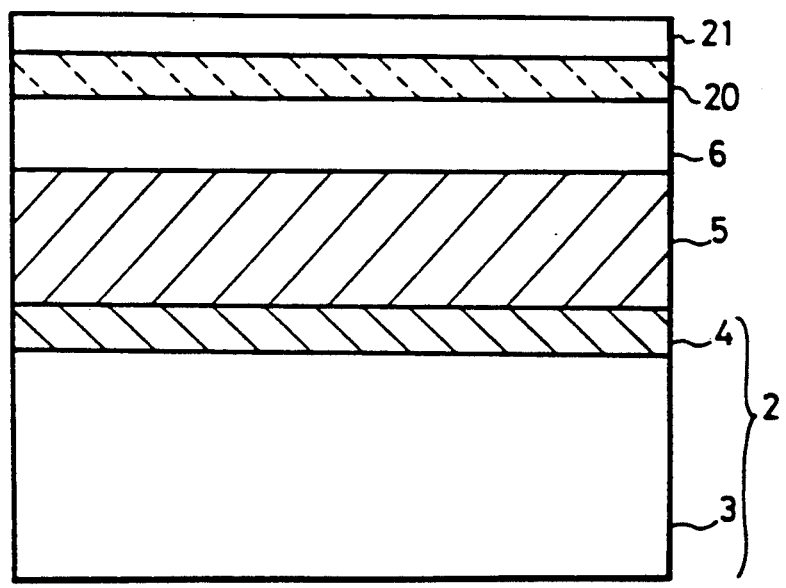
FIGS. 8–13 show cross-sections at various steps in a process of manufacturing the semiconductor photodetector device of the present invention.

(1) As shown in FIG. 8 the N-type InP buffer layer 4 is formed on the N+-type InP semiconductor layer 3 by vapor-phase growth. The layers 3 and 4 form a substrate 2. Using a vapor-phase growing technique the light-absorptive layer 5 of N−-type InGaAs is disposed on the layer 4, the light-transmissive layer 6 of, for example, N−-type InGaAsP or N−-type InP having a smaller relative dielectric constant than the material of the light-absorptive layer 5 is disposed on the layer 5 a contact layer 20 of N−-type InGaAs is formed on the layer 6, and then, a mask layer 21 of N−-type InP is disposed on the contact layer 20.

Figure 9:
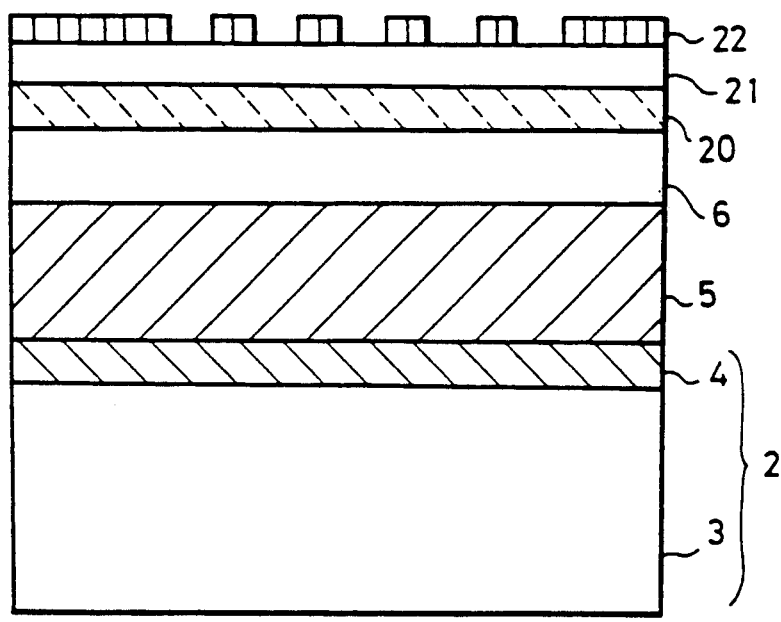

(2) Next, as shown in FIG. 9 SiN is deposited over the mask layer 21, as a material for patterning the mask layer 21. The film of SiN is then subjected to dry-etching with, for example, $CF_4$ to form an SiN film 22 with a desired pattern.

Figure 10:
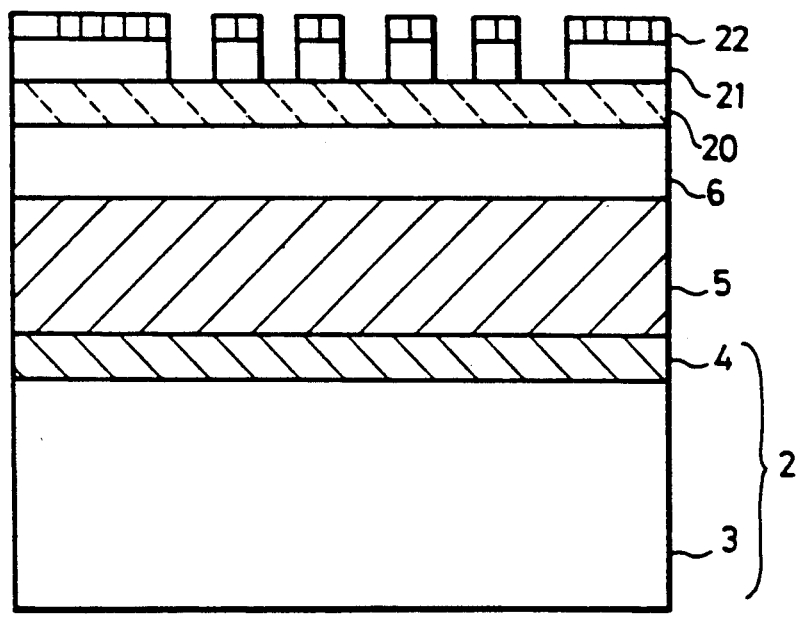

(3) After that as shown in FIG. 10, the N−-type InP mask layer 21 is etched with, for example, HCl using the SiN film 22 as an etching mask.

Figure 11:
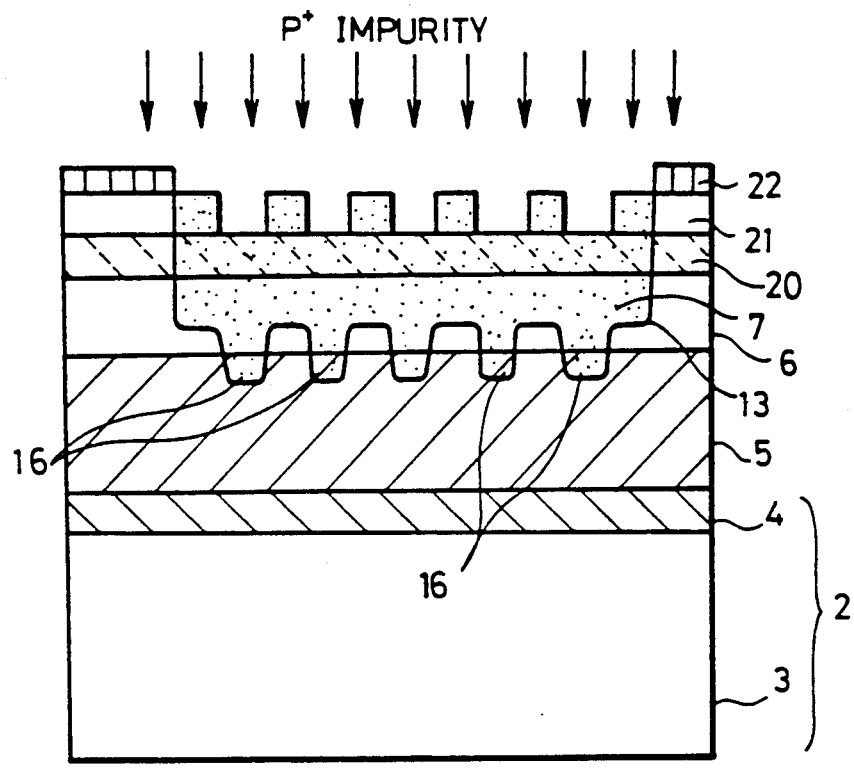

(4) Portions of the SiN film 22 which are located in the portions corresponding to the light-incident area of the device to be formed are removed by dry-etching with, for example, $CF_4$. Then a P+-type impurity is diffused to form the P+-type or second conductivity type diffusion region 7, as shown in FIG. 11. In this case, because of the presence of the mask layer 21, the diffusion of the P+-type impurity is shallow in the portions immediately beneath the mask layer 21. On the other hand the impurity is diffused through the spaces between the mask layer portions 21 deeper into the device to thereby form the projections 16 which extend into the light-absorptive layer 5.

Figure 12:
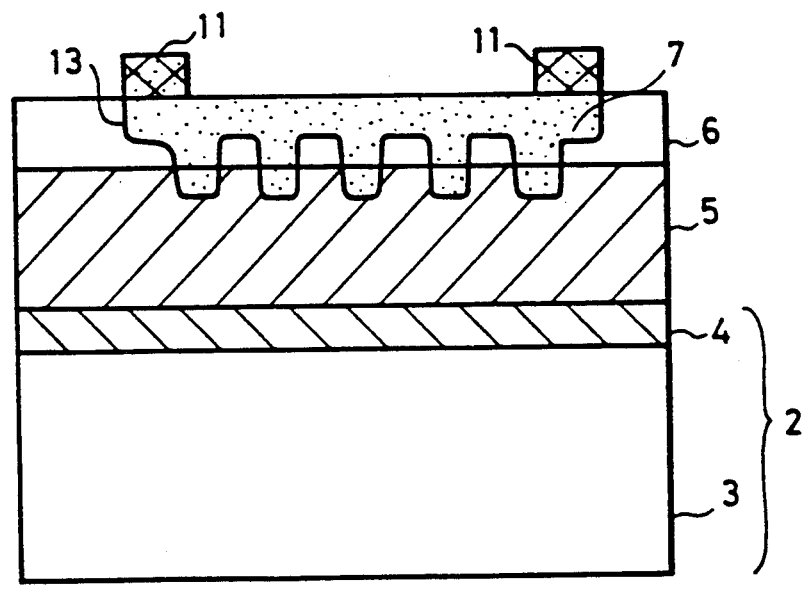

(5) After that, as shown in FIG. 12, the SiN film 22 and the mask layer 21 are removed. The contact layer 20 is removed, leaving the portion which is to be the electrode contact 11.

Figure 13:
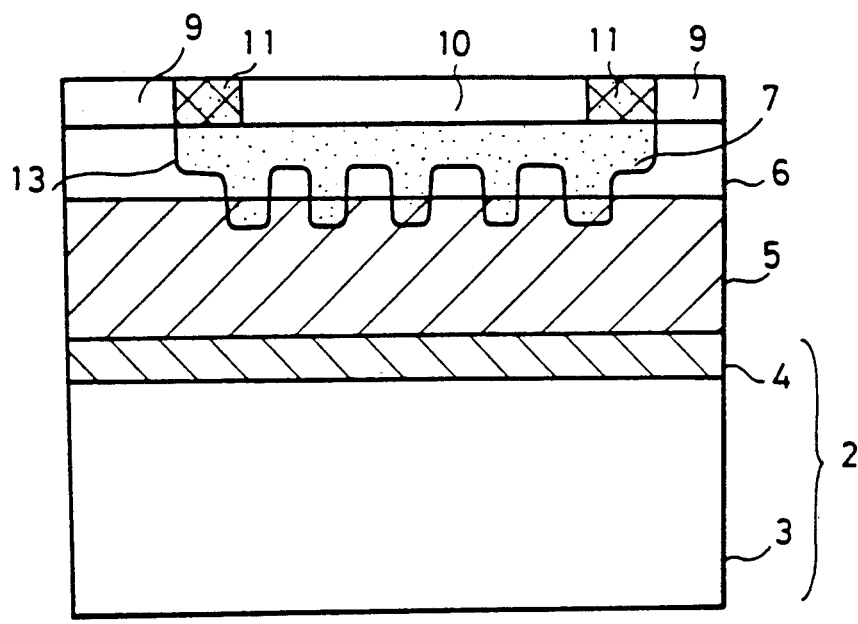

(6) Then, as shown in FIG. 13, $Si_3N_4$ is vapor deposited over the light-transmissive layer 6 to thereby form the surface protecting film 9 and the anti-reflection film 10. Thereafter, the N-electrode 1 is formed on the bottom surface of the semiconductor substrate 2 and the P-electrode 12 is formed on the surface protecting film 9 and the electrode contact 11. Thus, the semiconductor photodetector device of the present invention shown in FIG. 5 is completed.

Figure 14:
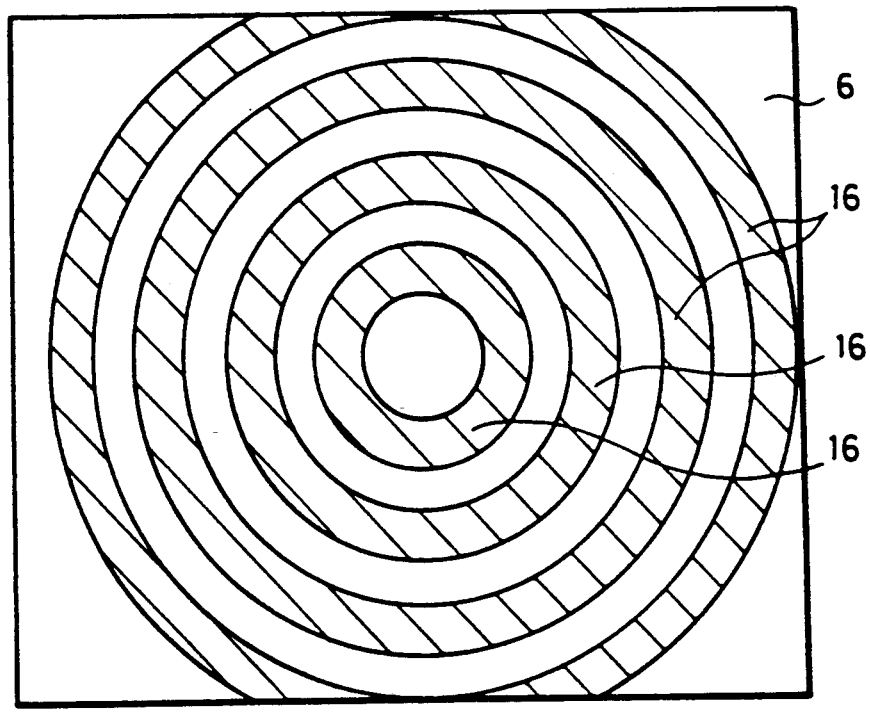
FIGS. 14 and 15 show different cross-sections equivalent to the cross-section shown in FIG. 6, which may be employed for the semiconductor photodetector device of the present invention.
Figure 15:
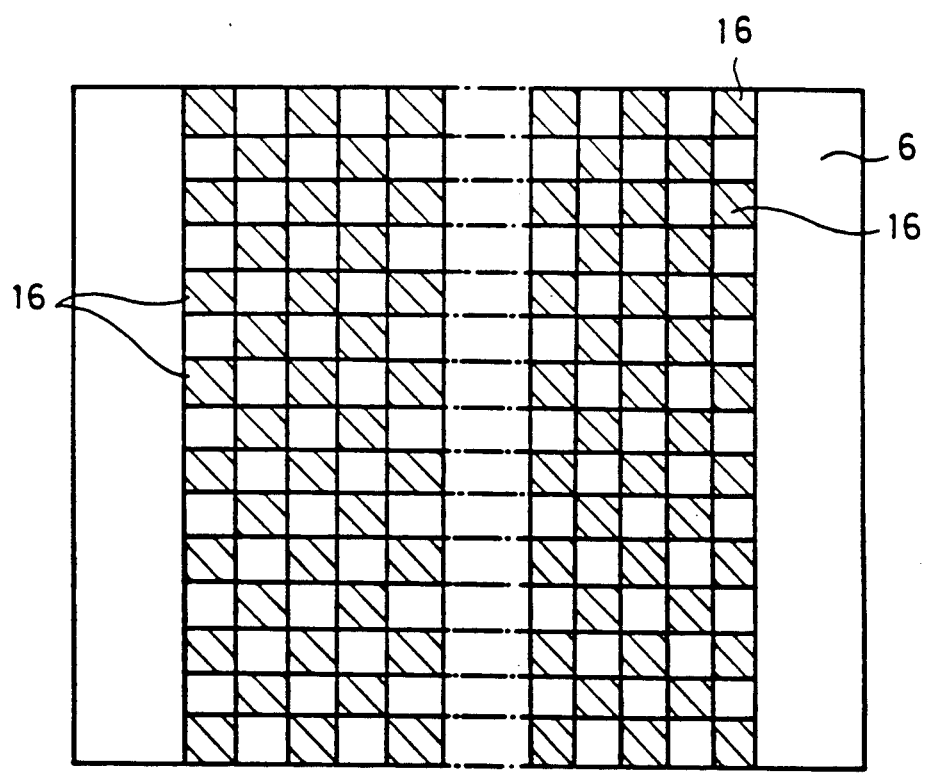

The present invention has been described by means of an embodiment in which the projections 16 of the P+-type diffusion region 7 are in the form of periodically repeating ridges extending in one direction (FIG. 6) so that the cross-section of the P+-type diffusion region 7 is comb-shaped with the "teeth" of the comb extending from the light-transmissive layer 6 into the light-absorptive layer 5. However, the transverse cross-section of the periodic projections 16 may be different from the one shown in FIG. 6. FIGS. 14 and 15 are cross-sectional views of another embodiments of the present invention corresponding to the cross-sectional view shown in FIG. 6. In the embodiment shown in FIG. 14, the projections 16 are concentric. In the embodiment shown in FIG. 15, the projections 16 are in a mosaic pattern or chessboard pattern.

As described in detail, the semiconductor photodetector device according to the present invention has a high response speed and provides light-induced current with zero bias, because the depletion region capacitance is small and the depletion region extends into the light-absorptive layer in the zero bias state.

What is claimed is:

1. A semiconductor photodetector device comprising:
   a semiconductor substrate of a first conductivity type;
   a semiconductor light-absorptive layer of said first conductivity type having a relative dielectric constant and disposed on said semiconductor substrate;
   a semiconductor light-transmissive layer of said first conductivity type having a thickness, disposed on said light-absorptive layer, and having a relative dielectric constant smaller than the relative dielectric constant of said light-absorptive layer; and
   a continuous region of a second conductivity type opposite said first conductivity type formed in part of said light-transmissive layer to a depth less than the thickness of said light-transmissive layer and including extensions extending from part of said light-transmissive layer into said light-absorptive layer.

2. A semiconductor photodetector device according to claim 1 wherein said extensions form a substantially periodic linear pattern extending into said light-absorptive layer.

3. A semiconductor photodetector device according to claim 1 wherein said extensions form a substantially concentric pattern extending into said light-absorptive layer.

4. A semiconductor photodetector device according to claim 1 wherein said extensions form a checkerboard pattern extending into said light-absorptive layer.

5. A semiconductor photodetector device comprising:
- an N-type InP semiconductor substrate;
- an N-type InGaAs light-absorptive layer having a relative dielectric constant and disposed on said semiconductor substrate;
- an N-type InGaAsP light-transmissive layer having a thickness and disposed on said light-absorptive layer, said light-transmissive layer having a relative dielectric constant smaller than the relative dielectric constant of said light-absorptive layer; and
- a P-type region formed in part of said light-transmissive layer to a depth less than the thickness of said light-transmissive layer and including extensions extending into said light-absorptive layer from part of said light-transmissive layer.

6. A semiconductor photodetector device comprising:
- an N-type InP semiconductor substrate;
- an N-type InGaAs light-absorptive layer having a relative dielectric constant and disposed on said semiconductor substrate;
- an N-type InP light-transmissive layer having a thickness and disposed on said light-absorptive layer, said light-transmissive layer having a relative dielectric constant smaller than the relative dielectric constant of said light-absorptive layer; and
- a P-type region formed in part of said light-transmissive layer to a depth less than the thickness of said light-transmissive layer and including extensions extending into said light-absorptive layer from part of said light-transmissive layer.

* * * * *